United States Patent [19]

Houseman

[11] 4,441,071

[45] Apr. 3, 1984

[54] TEMPERATURE COMPENSATION CIRCUIT FOR THERMOCOUPLES

[75] Inventor: Robin D. Houseman, La Habra, Calif.

[73] Assignee: Beckman Instruments, Inc., Fullerton, Calif.

[21] Appl. No.: 364,080

[22] Filed: Mar. 31, 1982

[51] Int. Cl.³ ............................................. G01R 17/02
[52] U.S. Cl. ...................................... 323/365; 374/181
[58] Field of Search ............................. 323/364–366, 323/369, 907; 219/494, 501, 505; 374/178–183, 185

[56] References Cited

U.S. PATENT DOCUMENTS

| | | |
|---|---|---|
| 3,092,998 | 6/1963 | Barton . |
| 3,102,425 | 9/1963 | Westman et al. . |
| 3,271,660 | 9/1966 | Hilbiber . |
| 3,281,656 | 10/1966 | Noble .......................... 323/907 X |
| 3,330,158 | 7/1967 | Simonyan et al. . |
| 3,420,104 | 1/1969 | Troemel et al. . |
| 3,440,883 | 4/1969 | Lightner . |
| 3,461,380 | 8/1969 | McGhee ........................ 374/181 X |
| 3,722,283 | 3/1973 | Treharne et al. . |
| 3,808,469 | 4/1974 | Raymond et al. ............. 323/365 X |
| 3,831,042 | 8/1974 | LaClaire . |
| 3,916,691 | 11/1975 | Hollander et al. .................. 374/181 |
| 3,967,188 | 6/1976 | Spencer . |
| 4,133,700 | 1/1979 | Hollander et al. .................. 374/181 |

Primary Examiner—Peter S. Wong
Attorney, Agent, or Firm—R. J. Steinmeyer; F. L. Mehlhoff; A. A. Canzoneri

[57] ABSTRACT

The present invention is directed to a circuit for generating a voltage for compensating the output of a thermocouple. The circuit provides a compensating voltage to enable the thermocouple to be operated with its reference junction at ambient temperature. The compensation voltage varies linearly with changes in the ambient temperature and passes through zero volts at 0° C. The compensation voltage is generated by combining a temperature variable voltage developed across one or more semiconductor junctions with a constant voltage of opposite polarity.

5 Claims, 3 Drawing Figures

TEMPERATURE COMPENSATION CIRCUIT FOR THERMOCOUPLES

This invention relates to a temperature compensation circuit for use with thermocouples operated with a reference junction at ambient temperature. More particularly the circuit provides compensation for variations in thermocouple output induced by variations in ambient temperature.

Thermocouples are well known in the field of temperature measurement and are frequently employed where there is a need for a fast responding, compact and inexpensive temperature sensor. An important characteristic of thermocouples is that they produce an output signal relative to two temperatures: a measurement temperature, and a reference temperature. This is so, because a thermocouple is basically a closed loop circuit formed by two different metals. The two points at which the metals join are called "junctions." One junction is designated as the "measuring" junction and the other junction is designated as the "reference" junction. When these junctions are immersed in differing temperature environments, an EMF is developed in the thermocouple.

In the traditional manner of use, the reference junction of a thermocouple is kept immersed in an ice water bath. The ice water bath serves as a simple temperature reference which is stable and repeatable. By inserting an EMF measuring instrument into the thermocouple loop, the thermocouple output signal is measured and may be converted into a temperature reading.

When portability is required in a temperature measuring system, the use of an ice water reference generally becomes impractical. Most portable instruments are designed to operate with the reference junction of the thermocouple at ambient temperature. Some form of compensation is necessary, therefore, to compensate for reading errors induced by variation of the ambient temperature. In past times it was common to apply such compensation to readings by some type of manual process, but the more common practice today is to employ integral automatic compensation within the measuring instrument.

As a rule, the variation of ambient temperature to which an indicating instrument is subjected is limited to a range comfortably tolerated by the user of the instrument. Thus, a compensation system, unlike a thermocouple, need function only over a relatively narrow range of temperatures. Fortunately, most thermocouples and other temperature responsive devices are quite linear over such a limited temperature range. Accordingly, the essential requirement of the compensation system is that it provide an output voltage linearly proportional to the ambient temperature, passing through zero volts at zero degrees Celsius (0° C.).

There are many known circuits for producing a temperature variable output voltage. Few of the known circuits, however, are sufficiently cost-effective to permit their use in modern low-cost instruments. Typical disadvantages of the known circuits include the use of specially manufactured or specially selected components to obtain required performance characteristics. In one form, such circuits typically employ a temperature responsive element such as a semiconductor junction as a voltage controlling element. The high cost of special semiconductor junctions with precisely known temperature characteristics makes their use impractical in very low-cost applications. If standard unselected semiconductor junctions are used, a relatively complex and therefore expensive procedure is required to calibrate the circuits for use over an extended temperature range. Calibration of the output, for example, is typically required at two predetermined temperatures to establish the slope of the output voltage. The time required to complete such calibration procedure is relatively long and renders the process unduly expensive.

Accordingly, there is disclosed an improved method and circuitry for compensating the temperature reading of a thermocouple wherein the aforesaid shortcomings of the prior art are overcome.

SUMMARY OF THE INVENTION

The present invention is directed to a circuit for generating a voltage for compensating the output of a thermocouple. The thermocouple has at least one reference junction and a measuring junction and compensation is provided to enable the thermocouple to be operated with its reference junction at ambient temperature. The compensation voltage varies linearly with changes in the ambient temperature and passes through zero volts at 0° C.

A first source of constant potential is applied through a variable resistor across at least one semiconductor device developing a voltage thereacross in a forward biased direction. The developed voltage is divided by a first voltage dividing means. A second source of constant potential of opposite polarity is divided by a second voltage dividing means. The divided voltage of the first voltage dividing means and the divided voltage of the second voltage dividing means are combined at an output terminal. The combined voltage at the output terminal has a temperature coefficient corresponding to a selected thermocouple type over a selected temperature range.

The variable resistor is adjusted to set the combined voltage at the output terminal to a level corresponding to the output of the selected thermocouple type when the measuring junction thereof is at an equivalent temperature and at least one reference junction thereof is at 0° C.

DETAILED DESCRIPTION

Figure 1:
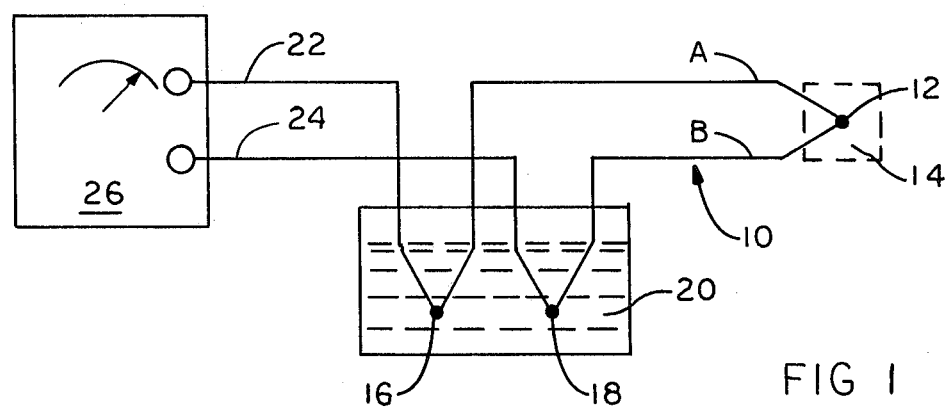
FIG. 1 is a schematic representation of a thermocouple having two reference junctions immersed in an ice water bath, and connected to a temperature indicating instrument, and connected to a temperature indicating instrument.

As shown by FIG. 1, a typical temperature measuring device includes a thermocouple 10 constructed of metal wire A and metal wire B, both of which are joined at one end to form measuring junction 12 which is immersed in a temperature environment 14. The other end of metal wire A forms a reference junction 16 with copper wire 22 which is connected to temperature indicating instrument 26. Similarly, metal wire B forms a reference junction 18 with copper wire 24 connected to temperature indicating instrument 26. Reference junctions 16 and 18 are immersed in an ice water bath 20.

Figure 2:
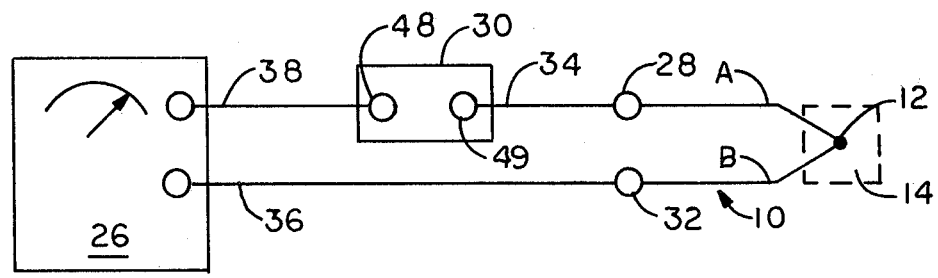
FIG. 2 is a schematic representation of a thermocouple having two reference junctions at ambient temperature connected to the thermocouple compensation circuit of the invention, and a temperature indicating instrument.

Referring now to FIG. 2, a portable temperature measuring system utilizing the compensation circuit of the present invention is shown in schematic form. Thermocouple 10 is shown as before, except that metal wire A forms a reference junction 28 with copper wire 34 which is connected to compensation circuit 30. Also, metal wire B of thermocouple 10 forms a reference junction 32 with copper wire 36 which is connected to an input of temperature indicating instrument 26. A copper wire 38 connects compensation circuit 30 to an input of temperature indicating instrument 26.

To illustrate the function of the compensation circuit, let it be assumed that the ambient temperature is 25° C., and that temperature environment 14 is 125° C. There is, therefore, a 100° temperature difference between the measuring junction 12 and the reference junctions 28 and 32. Taking a type K thermocouple (chromel/alumel), as an example, an EMF would be developed corresponding to 40 $\mu V/°C$. or a total of 4 mV would be developed. In such a case, the compensation circuit 30 would be calibrated to generate 40 $\mu V/°C$. or 1 mV at 25° C. which is placed in series with the 4 mV output of the thermocouple. Thus, the input to the temperature indicating instrument 26 would be 5 mV which corresponds to the output of this thermocouple type when used with an ice water reference.

Figure 3:
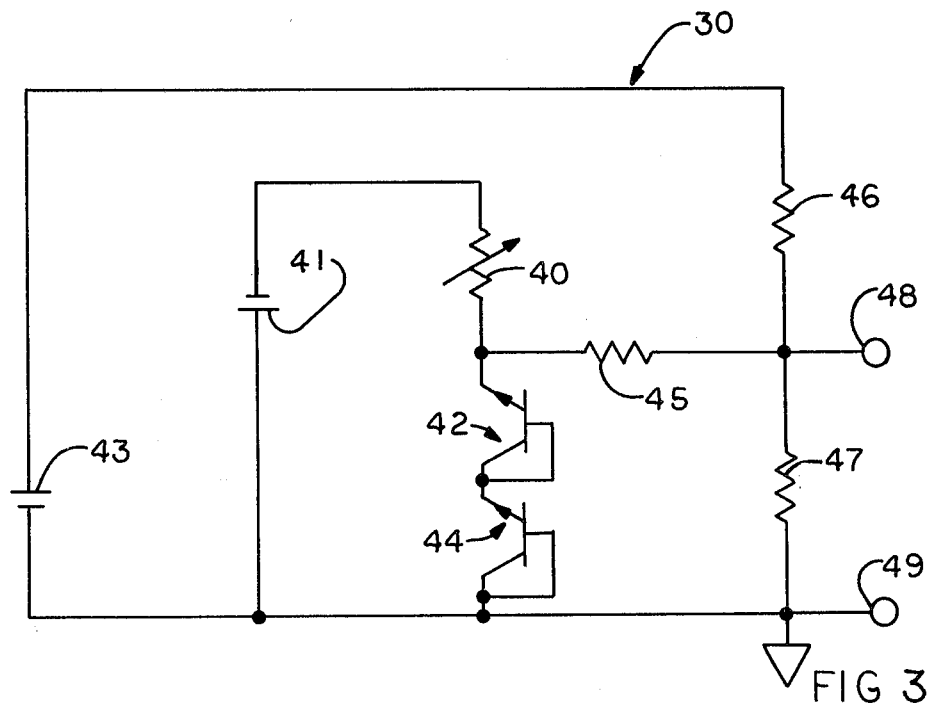
FIG. 3 is a schematic diagram of the thermocouple cmpensation circuit of the invention.

Reference now to FIG. 3, there is shown a schematic diagram of the compensation circuit of the invention, generally denoted by reference numeral 30. A variable resistor 40 is connected to the base-to-emitter junctions of series connected transistors 42 and 44. A first source of constant potential 41 is connected across variable resistor 40 and transistors 42 and 44 causing a constant current to flow therethrough. The setting of variable resistor 40 determines the amplitude of this current and therefore the voltage which is developed in a forward biased direction across the base-to-emitter junction of transistors 42 and 44. The developed voltage is fed into a first voltage divider formed by resistors 45 and 47.

At the junction of resistors 45 and 47 there is connected an output terminal 48. Also connected to output terminal 48 is one end of resistor 46 which, in conjunction with resistor 47, forms a second voltage divider. A second source of constant potential 43, which is of opposite polarity to source 41, is connected to the other end of resistor 46. Thus, the arrangement is such that the divided voltage of the first source 41 and the divided voltage of the second source 43 are combined at output terminal 48.

Since the divided voltage of the first source 41 is developed across the base-to-emitter junctions of transistors 41 and 44, the voltage is temperature variable according to the voltage temperature coefficient of the specific semiconductor type. It has been found that for a type 2N5088 transistor using a current flow in the region of 0.8 $\mu A$, the change in base-to-emitter voltage ($\Delta V_{BE}$) is approximately 2.5 mV/°C. The amplitude of the first divided voltage is adjusted by means of variable resistor 40 so that at a temperature of 0° C. it will be equal and opposite to the second divided voltage. The sum of these voltages at output terminal 48, therefore, would equal zero at 0° C. Advantageously, this single calibration of the output of the compensation circuit can be made at a convenient room temperature. This is accomplished by adjusting the voltage at terminal 48 proportionally to the given ambient temperature. Thus, by suitably dividing the base-to-emitter voltage, and providing an offsetting second divided voltage, a resulting output voltage is developed having a linear temperature slope which closely approximates 40 $\mu V/°C$. and which passes through zero volts at 0° C.

It may appear that the foregoing calibration process could be accomplished with equal advantage by varying a circuit element other than resistor 40. For example, it might be reasoned that if resistor 46 were made variable instead of fixed, the amplitude of the offset voltage could be varied, and thus would enable the forward voltage of the semiconductor to be cancelled at the selected reference temperature (0° C.). While this alternate method does appear to produce the desired result, it does not in fact accomplish it with the same effectiveness as the method of the invention previously disclosed. The reason for this will be explained in the following paragraph from which it should be clear that various other "obvious" approaches to the calibration process suffers from a cost or performance disadvantage not found in the method of the invention.

It has been found that in adjusting the resistance of resistor 40 to calibrate the output voltage, a synergistic result is obtained. By this process, the current flowing through the semiconductor junctions is varied; this produces a change in the forward voltage, and, therefore, the resultant output voltage. When this method of calibration was used on a group of parts, it was found that the amount of variation of voltage temperature coefficient (TEMCO) of the semiconductor junctions was reduced. This reduction in the TEMPCO spread between individual semiconductors, while not dramatic, was nevertheless significant because it enabled unselected semiconductors of ordinary manufacture to be used. In terms of quantity manufacture, this result represents a considerable cost saving over the use of premium semiconductors.

In one example utilizing the method of the invention, a group of 41 circuit units using Type 2N5088 transistors produced by two different manufacturers and having several different dates of manufacture were found to have, under conditions of constant current and temperature, measured variation or spread in forward voltage ($V_{BE}$) of 4%. After varying the current to obtain a specified $V_{BE}$, a reduction was obtained in TEMPCO spread from 3.6% to 1.2%.

Since the reduction obtained in TEMPCO spread is not predicted by the equations that define the ideal diode, the cause of the improvement is not precisely understood. It is speculated, however, that in adjusting the semiconductor current to vary $V_{BE}$ a more favorable operating point is reached, wherein the exhibited TEMPCO is nearer to an ideal or theoretical value.

The following table gives the values of the components identified in FIG. 3.

| Reference Numeral | Name of Component | Value |
| --- | --- | --- |
| 40 | Variable Resistor | 2.3M ohms |
| 46 | Resistor | 1.405M ohms |
| 46 | Resistor | 1.53M ohms |
| 47 | Resistor | 12.24K ohms |
| 42 | Transistor | 2N5088 |
| 44 | Transistor | 2N5088 |
| 41 | Potential Source | −1.52 volts |
| 43 | Potential Source | +1.2 volts |

While in accordance with the patent statutes there has been described what at present is considered to be a preferred embodiment of the invention, it will be understood to those skilled in the art that various changes and modifications may be made therein without departing from the invention and it is, therefore, the aim of the appended claims to cover all such changes and modifications as fall within the true spirit and scope of the invention.

What is claimed is:

1. A circuit for generating a voltage for compensating the output of a thermocouple having at least one reference junction and a measuring junction, when said thermocouple is operated with its reference junction at ambient temperature, wherein said compensation voltage varies linearly with changes in ambient temperature and passing through zero volts at 0° C. comprising:

a first source of constant potential;

at least one semiconductor rectifying device;

a variable resistor connected intermediate said first source of potential and said semiconductor device;

said first source of constant potential and said variable resistor causing a constant but adjustable current to flow in said semiconductor device developing a voltage thereacross in a forward biased direction;

first voltage dividing means for dividing said voltage developed across said semiconductor device;

a second source of constant potential opposite in polarity to said first source of potential;

second voltage dividing means for dividing said second source of potential;

an output terminal wherein the divided voltage of said first voltage dividing means and the divided voltage of said second voltage dividing means are combined at said output terminal and wherein said combined voltage having a voltage temperature coefficient corresponding to a selected thermocouple type over a selected temperature range;

said variable resistor being adjustable to set the combined voltage at said output terminal to a level corresponding to the output of said selected thermocouple type when the measuring junction thereof is at an equivalent temperature and at least one reference junction thereof is at 0° C.

2. The circuit defined in claim 1 wherein the combined voltage appearing at said output terminal changes with temperature at a rate of 40 $\mu$V/°C.

3. The circuit defined in claims 1 or 2 wherein the combined voltage at said output terminal equals zero at 0° C.

4. The circuit defined in claim 1 wherein said thermocouple type comprises a type K thermocouple.

5. The circuit as defined in claim 1 wherein said voltage temperature coefficient of said semiconductor device is reduced when said variable resistor is adjusted to set said combined voltage at said output terminal to a level corresponding to the output of said selected themocouple type when the measuring junction thereof is at an equivalent temperature and at least one reference junction thereof is at 0° C.

* * * * *